United States Patent
Kim et al.

(10) Patent No.: US 6,175,481 B1
(45) Date of Patent: Jan. 16, 2001

(54) SEMICONDUCTOR DEVICE HAVING A DEACTIVATION FUSE

(75) Inventors: Yank-Gyun Kim; Jeung-In Lee, both of Seoul (KR)

(73) Assignee: Samsung Electronics Co., LTD (KR)

( * ) Notice: Under 35 U.S.C. 154(b), the term of this patent shall be extended for 0 days.

(21) Appl. No.: 09/274,403

(22) Filed: Mar. 23, 1999

(30) Foreign Application Priority Data

Apr. 10, 1998 (KR) .................................................. 98-12852

(51) Int. Cl.[7] ...................................................... H02H 5/00

(52) U.S. Cl. ........................................... 361/104; 361/115

(58) Field of Search ..................................... 361/103, 104, 361/115

(56) References Cited

U.S. PATENT DOCUMENTS

| 4,412,241 | 10/1983 | Nelson | 357/51 |
| 4,451,839 | 5/1984 | Nelson | 357/13 |
| 4,621,346 | * 11/1986 | McAdams | 365/227 |

* cited by examiner

*Primary Examiner*—Stephen W. Jackson
(74) *Attorney, Agent, or Firm*—Samuels, Gauthier & Stevens LLP

(57) ABSTRACT

A semiconductor device having a deactivation fuse includes logic circuit and at least two active elements. The logic circuit generates at least two internal control signals in response to an external control signal. The at least two active elements are connected in series with each other, and generate an output signal having a predetermined voltage in response to the internal control signals. The fuse is coupled to the active elements and logic circuit so as to minimize power consumption.

13 Claims, 3 Drawing Sheets

SEMICONDUCTOR DEVICE HAVING A DEACTIVATION FUSE

BACKGROUND OF THE INVENTION

A deactivation fuse is employed to selectively deactivate a portion of the circuits comprising a semiconductor device. For example, it may be determined during manufacturing that certain circuits, or groups of circuits, are malfunctioning, in which case, the malfunctioning circuits can be deactivated, thereby preserving the utility of the remainder of the circuits in the semiconductor device.

FIG. 1 is a schematic circuit diagram of a conventional semiconductor device having a deactivation fuse. Referring to FIG. 1, the conventional semiconductor device 101 includes a power source pin 111, a ground pin 121, a switching element 131, a resistor 141, a deactivation fuse element 151, an inverter 161 and an internal circuit 171. The switching element 131 is used for opening the deactivation fuse 151. In other words, if the switching element 131 is activated by a control signal C, power supply voltage Vdd is applied to the deactivation fuse 151 through the power source pin 111, thereby supplying high current, which opens the fuse 151 so that it no longer conducts, causing voltage Vo to be driven to a low state, thereby disabling internal circuit 171.

In FIG. 1, assuming that the deactivation fuse 151 is conducting, with power supply voltage Vdd applied to the resistor 141, the input voltage of the inverter 161 remains at a ground voltage (GND) level. Thus, the output Vo of the inverter 161 is driven to a high logic level. If the fuse 151 is opened, then if the power supply voltage Vdd is applied to the resistor 141, the input voltage of the inverter 161 rises to the power supply voltage (Vdd) level. Thus, the output voltage Vo of the inverter 161 is driven to a logic low level. In other words, the output of the inverter 161 changes according to the conducting state of the fuse 151.

In the conventional semiconductor device 101, current flows through the resistor 141 so long as the power supply voltage Vdd is applied to the resistor 141, whether the fuse 151 is opened or closed. This amounts to unnecessary power consumption by the semiconductor device 101.

SUMMARY OF THE INVENTION

To address the above problem, it is an object of the present invention to provide a semiconductor device having a deactivation fuse circuit which has lower power consumption than that of the prior art.

Accordingly, to achieve the above object, there is provided a semiconductor device comprising a logic circuit, at least two active elements, and a deactivation fuse.

The logic circuit generates first and second internal control signals in response to an external control signal.

The first and second active elements are connected in series with each other, the first active element receiving a power supply voltage, the first and second active elements generating an output signal having a predetermined voltage in response to the corresponding internal control signals.

The deactivation fuse is connected between the second active element, and a ground terminal.

If the external control signal is activated, at least one of the two or more active elements operates so that the output signal having a predetermined voltage is latched.

According to the present invention, the power consumption of the semiconductor device having the deactivation fuse is reduced as compared to conventional techniques.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE PREFERRED EMBODIMENTS

Preferred embodiments of the present invention will now be described in detail with reference to the accompanying drawings.

Figure 1:
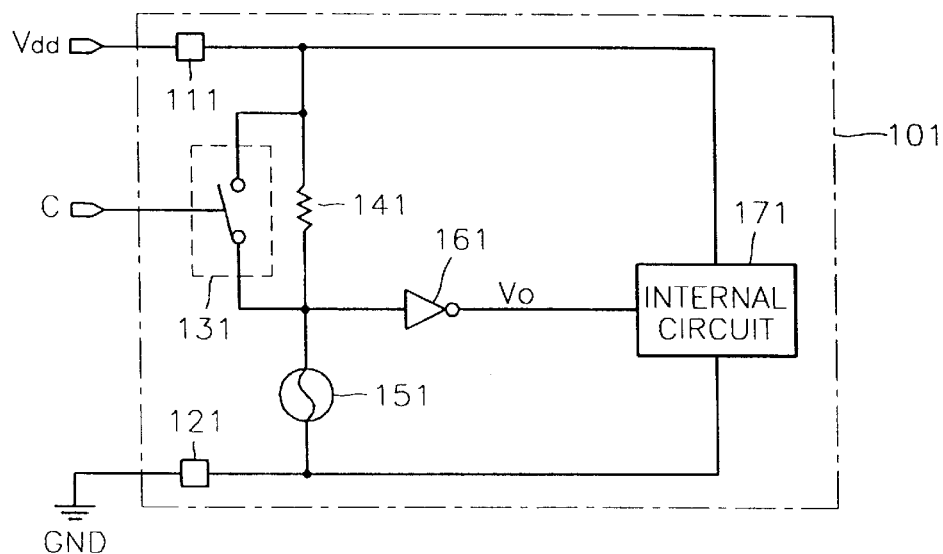
FIG. 1 is a schematic circuit diagram illustrating a conventional semiconductor device having a deactivation fuse.
Figure 2:
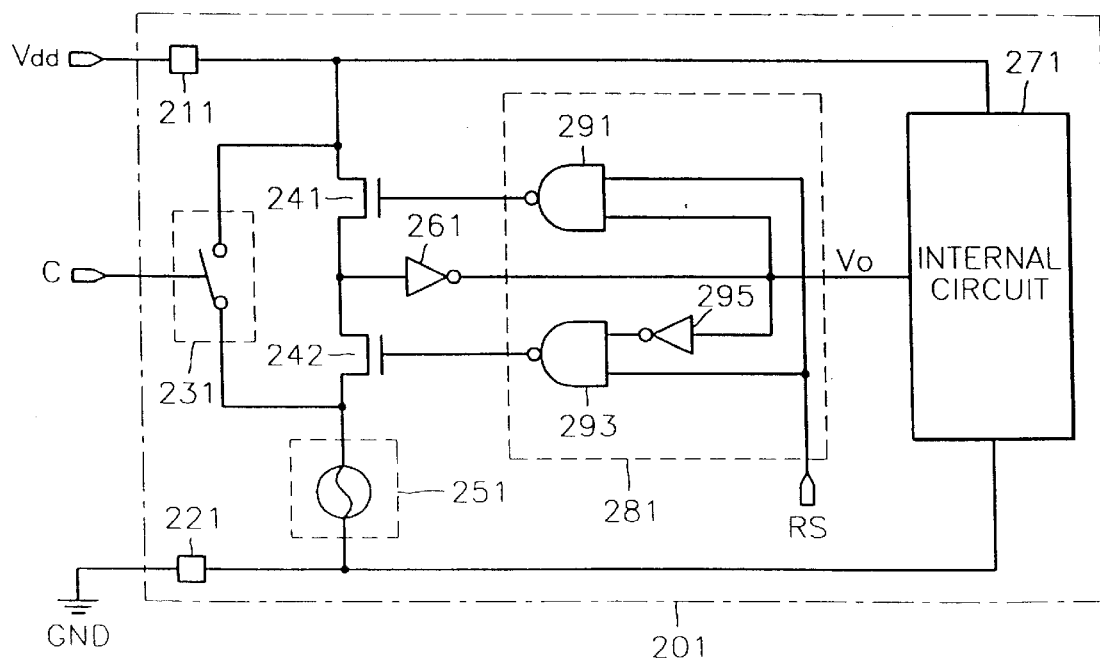
FIG. 2 is a schematic circuit diagram illustrating a semiconductor device having a deactivation fuse according to a first embodiment of the present invention.

FIG. 2 is a schematic circuit diagram illustrating a semiconductor device having a deactivation fuse (sometimes referred to in the art, and referred to hereinafter as a "zapping element") according to a first embodiment of the present invention. Referring to FIG. 2, the semiconductor device 201 includes a power source pin 211, a ground pin 221, a switching element 231, first and second active elements, that is, first and second NMOS transistors, 241, 242, a zapping element 251, an inverter 261, a logic circuit 281 and an internal circuit 271.

External power supply voltage Vdd is applied to the power source pin 211 to supply power to circuits connected to the power source pin 211, e.g., the internal circuit 271. The ground pin 221 is connected to an external ground terminal GND, in order to ground circuits connected thereto 221, e.g., the internal circuit 271.

The power source pin 211 is connected to the drain of the first NMOS transistor 241, and the first and second NMOS transistors 241, 242 are connected in series with each other, such that the source of the first NMOS transistor 241 is connected to the drain of the second NMOS transistor 242. The input terminal of the inverter 261 is coupled to the connection point of the source of the first NMOS transistor 241 and the drain of the second NMOS transistor 242, and the output terminal of the inverter 261 generates an output signal Vo. The first and second NMOS transistors 241, 242 are both gated by outputs of the logic circuit 281.

The sizes of the first and second NMOS transistors 241, 242 are determined in consideration of their desired turn-on resistances. The turn-on resistance of the first NMOS transistor 241 is preferably larger than that of the second NMOS transistor 242. In a condition where the zapping element 251 is a short circuit, if an external control signal RS, e.g., a reset signal, is applied, the input voltage of the inverter 261 transitions to a low logic level. For the input voltage of the inverter 261 to fall to a sufficiently low level, the turn-on resistance of the second NMOS transistor 242 must be sufficiently smaller than that of the first NMOS transistor 241. In a condition where the zapping element 251 is an open circuit, if an external control signal RS is applied, then the input voltage of the inverter 261 rises to a high logic level. For the input voltage of the inverter 261 to rise to a sufficiently high level, the turn-on resistance of the first NMOS transistor 241 must be sufficiently smaller than that of the second NMOS transistor 242. If the zapping element 251 is open, it should have infinite resistance. However, in practice, the zapping element 251 may actually have a large but finite resistance. Thus, the sum of the turn-on resistances of the first and second NMOS transistors 241, 242 should be sufficiently smaller than the minimum resistance of the open zapping element 251.

The switching element 231 is employed for opening the fuse of the zapping element 251. If the control signal C is activated to a high logic level, the switching element 231 serves to transmit the power supply voltage Vdd to the zapping element 251. The zapping element 251 becomes an open circuit when the power supply voltage Vdd is applied thereto. In an alternative embodiment, the zapping element 251 may be opened using an externally-applied predetermined voltage without using the switching element 231. In such a case, the zapping element 251 is preferably formed of a material which will stop conducting ("blow") when a predetermined voltage is applied thereto, e.g., polysilicon or metal. The zapping element 251 may further comprise an element which opens when a voltage less than or equal to a predetermined level is applied thereto, e.g., a Zener diode. The zapping element 251 is connected between the second NMOS transistor 242 and the ground pin 221.

The logic circuit 281 controls the operation of the first and second NMOS transistors 241, 242, in response to the external control signal RS. The logic circuit 281 includes a first NAND gate 291, a second NAND gate 293 and an inverter 295. The first NAND gate 291 performs a NAND operation on the external control signal RS and the inverter output signal Vo, the result of which is applied to the gate of the first NMOS transistor 241. In other words, if either the external control signal RS or the output signal Vo is at a low logic level, then the output of the first NAND gate 291 transitions to "high". If both the external control signal RS and the output signal Vo are at a logic high level, the output of the first NAND gate 291 transitions to "low". The inverter 295 inverts the output signal Vo, which is applied to the second NAND gate 293. The second NAND gate 293 performs a NAND operation on the output of the inverter 295 and the external control signal RS and applies the result to the gate of the second NMOS transistor 242. In other words, if either the output of the inverter 295 or the external control signal RS is at a low logic level, the output of the second NAND gate 293 transitions to "high". If both the output of the inverter 295 and the external control signal RS are at a logic high level, the output of the second NAND gate 293 transitions to "low".

The operation of the zapping circuit shown in FIG. 2 will now be described, in terms of two conditions, one where the zapping element 251 conducts and the other where the zapping element 251 is open, and therefore does not conduct. It is assumed that the switching element 231 is open, and the power source pin 211 and ground pin 221 are connected to the power supply voltage Vdd and the ground terminal GND, respectively.

First, the operation of the zapping circuit of FIG. 2 will be described in the case when the zapping element 251 conducts. Initially, the external control signal RS is held low (assuming an active-low reset). The first and second NAND gates 291, 293 therefore both output logic high level signals. Accordingly, the first and second NMOS transistors 241, 242 are both activated, and thus the input voltage of the inverter 261 falls to the voltage of the ground terminal GND. Therefore, the output signal Vo becomes "high". Even though the output signal Vo of a logic high level is input to the first NAND gate 291, the output of the first NAND gate 291 is held high, since the external control signal RS is still maintained at a logic low level, and thus the first NMOS transistor 241 remains activated. The output signal Vo being at a logic high level is inverted by the inverter 295 and input to the second NAND gate 293. Since two inputs of the second NAND gate 293 are both at a logic low level, the output of the second NAND gate 293 is still held high. Thus, the second NMOS transistor 242 remains activated.

When the external control signal RS transitions from a logic low level to a logic high level, the inputs of the first NAND gate 291 are both at a logic high level, and the output of the first NAND gate 291 is changed to a logic low level. Thus, the first NMOS transistor 241 is deactivated, or "off". The output of the second NAND gate 293 is held high since the output of the inverter 295 is at a logic low level. Since the output of the second NAND gate 293 is at a logic high level, the second NMOS transistor 242 is maintained at an activated state. Thus, the output signal Vo is latched to a logic high level.

The operation of the zapping circuit will now be described for the case when the zapping element 251 becomes an open circuit. Initially, the external control signal RS is held low, and the first and second NAND gates 291, 293 both output logic high signals. Accordingly, the first and second NMOS transistors 241, 242 are both active, or "on". However, since the zapping element 251 is opened, the input voltage of the inverter 261 increases to nearly the power supply voltage Vdd. Therefore, the output signal Vo transitions to "low". Since the external control signal RS at a logic low level and the output signal Vo at a logic low level are input to the first NAND gate 291, the output of the first NAND gate 291 is held high, whereby the first NMOS transistor 241 remains on. The output signal Vo, at a logic low level, is inverted by the inverter 295 and input to the second NAND gate 293. Although the output of the inverter 295 is at a logic high level, the external control signal RS is at a logic low, so the output of the second NAND gate 293 remains high. Thus, the second NMOS transistor 242 remains on.

When the external control signal RS transitions from a logic low level to a logic high level, the output of the first NAND gate 291 is held high since the output signal Vo is at a logic low level. Thus, the first NMOS transistor 241 remains on. If the external control signal RS is activated to a logic high level, the inputs of the second NAND gate 293 are both at a logic high level, so the output of the second NAND gate 293 changes to a logic low level, turning off the second NMOS transistor 242. Thus, the output signal Vo is latched to a logic low level.

As described above, when the zapping element 251 is a short circuit, and the external control signal RS transitions to a logic high level, the output signal Vo is latched to a logic high level. At this time, since the first NMOS transistor 241 is turned off, the power consumption of the semiconductor device 201 is reduced as compared to conventional configurations. When the zapping element 251 is an open circuit and the external control signal RS transitions to a logic high level, the output signal Vo is latched to a logic low level. At this time, since the second NMOS transistor 242 is turned off, the power consumption of the semiconductor device 201 is reduced as compared to conventional configurations.

Figure 3:
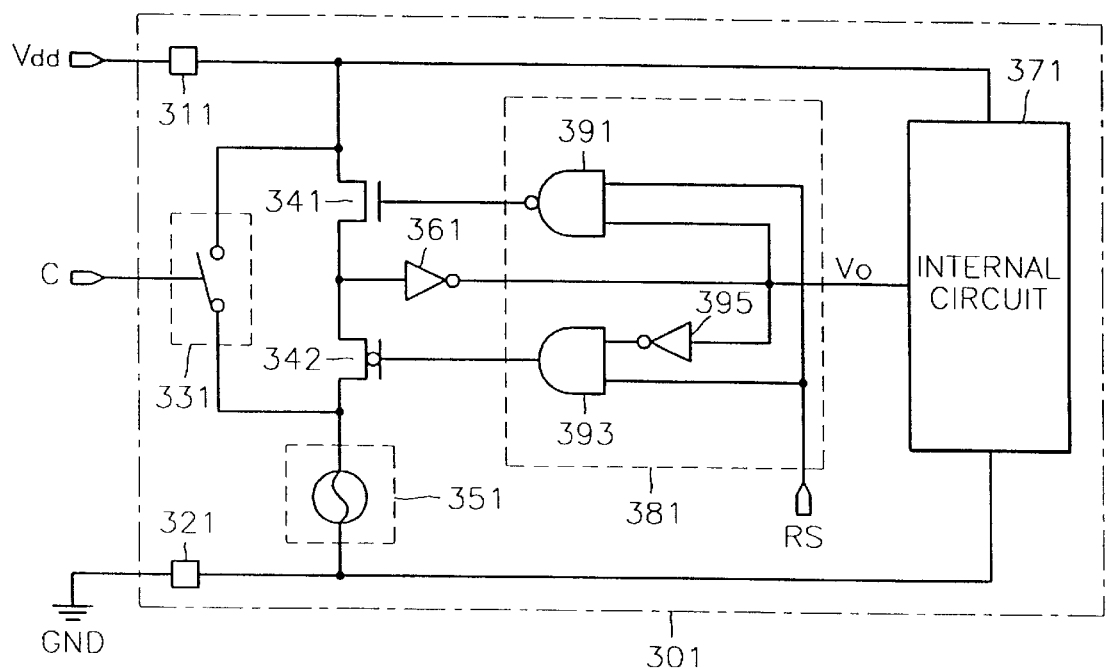
FIG. 3 is a schematic circuit diagram illustrating a semiconductor device having a deactivation fuse according to a second embodiment of the present invention.

FIG. 3 is a schematic circuit diagram illustrating a semiconductor device 301 having a zapping circuit according to a second embodiment of the present invention. Referring to FIG. 3, the semiconductor device 301 includes a power source pin 311, a ground pin 321, a switching element 331, a first active element, that is, an NMOS transistor 341, a second active element, that is, a PMOS transistor 342 a zapping element 351, an inverter 361, a logic circuit 381 and an internal circuit 371. The switching element 331, the power source pin 311, the ground pin 321 and the zapping element 351 have the same configuration and operation as those of the semiconductor device 201 shown in FIG. 2.

The power source pin 311 is connected to the NMOS transistor 341, and the NMOS transistor 341 and the PMOS transistor 342 are connected in series with each other. In other words, the power source pin 311 is connected to the drain of the NMOS transistor 341, and the source of the NMOS transistor 341 is connected to the drain of the PMOS transistor 342. The input terminal of the inverter 361 is coupled to the connection point of the source of the NMOS transistor 341 and the drain of the PMOS. transistor 342, and an output signal Vo is generated by the inverter 361. The NMOS transistor 341 and the PMOS 342 are both gated by the outputs of the logic circuit 381, as described above.

The sizes of the NMOS transistor 341 and the PMOS transistor 342 are determined in consideration of their desired turn-on resistances. The turn-on resistance of the NMOS transistor 341 is preferably larger than that of the PMOS transistor 342. In a state where the zapping element 351 is a short circuit, if an external control signal RS is applied, the input voltage of the inverter 361 falls to a logic low level. For the input voltage of the inverter 361 to fall to a sufficiently low level, the turn-on resistance of the PMOS transistor 342 must be sufficiently smaller than that of the NMOS transistor 341. In a condition where the zapping element 351 is open, if an external control signal RS is applied, the input voltage of the inverter 361 rises to a logic high level. At this time, for the input voltage of the inverter 361 to rise to a sufficiently high level, the turn-on resistance of the NMOS transistor 341 must be sufficiently larger than that of the PMOS transistor 342.

The logic circuit 381 controls the operation of the NMOS transistor 341 and the PMOS transistor 342 in response to the external control signal RS, e.g., a reset signal. The logic circuit 381 includes a NAND gate 391, an AND gate 393, and an inverter 395. The NAND gate 391 performs a NAND operation on the external control signal RS and the output signal Vo and applies the result to the gate of the NMOS transistor 341. In other words, if either the external control signal RS or the output signal Vo is at a logic low level, then the output of the NAND gate 391 transitions to "high". If both the external control signal RS and the output signal Vo are at a logic high level, then the output of the NAND gate 391 transitions to "low". The inverter 395 inverts the output signal Vo, which is applied to the AND gate 393. The AND gate 393 performs an AND operation on the output of the inverter 395 and the external control signal RS and applies the result to the gate of the PMOS transistor 342. In other words, if either the output of the inverter 395 or the external control signal RS is at a logic low level, then the output of the AND gate 393 becomes "low". If both the output of the inverter 395 and the external control signal RS are at a logic high level, then the output of the AND gate 393 becomes "high".

The operation of the zapping circuit shown in FIG. 3 will now be described, in terms of two conditions, one where the zapping element 351 is shorted and the other where the zapping element 351 is open. It is assumed that the switching element 331 is open, and the power source pin 311 and ground pin 321 are connected to the power supply voltage Vdd and the ground terminal GND, respectively.

First, the operation of the zapping circuit of FIG. 3 will be described in the case when the zapping element 351 is shorted. Initially, the external control signal RS is held low. The NAND gate 391 outputs a logic high level signal, and the AND gate 393 outputs a logic low level signal. Accordingly, the NMOS transistor 341 and the PMOS transistor 342 are both turned on, and thus the input voltage of the inverter 361 falls to the voltage of the ground terminal GND. Therefore, the output signal Vo becomes "high". Even though the output signal Vo at a logic high level is input to the NAND gate 391, the output of the NAND gate 391 is held high, since the external control signal RS is still maintained at a logic low level, and thus the NMOS transistor 341 remains on. The output signal Vo being at a logic high level is inverted by the inverter 395 and input to the AND gate 393. Since two inputs of the AND gate 393 are both at a logic low level, the output of the AND gate 393 is still held low. Thus, the PMOS transistor 342 remains on.

When the external control signal RS transitions from a logic low level to a logic high level, the inputs of the NAND gate 391 are both at a logic high level, and the output of the NAND gate 391 is changed to a logic low level. Thus, the NMOS transistor 341 is turned off. The output of the AND gate 393 is held low since the output of the inverter 395 is at a logic low level. Since the output of the AND gate 393 is at a logic low level, the PMOS transistor 342 remains on. Thus, the output signal Vo is latched to a logic high level.

The operation of the zapping circuit of FIG. 3 will now be described for the case when the zapping element 351 is open. Initially, the external control signal RS is held low, and the NAND gate 391 outputs a logic high level signal and the AND gate 393 outputs logic low level signal. Accordingly, the NMOS transistor 341 and the PMOS transistor 342 are both turned on. However, since the zapping element 351 is an open circuit, the input voltage of the inverter 361 increases to nearly the power supply voltage Vdd. Therefore, the output signal Vo becomes "low". Since the output signal Vo at a logic low level is input to the NAND gate 391, the output of the NAND gate 391 is held high, whereby the NMOS TRANSISTOR 341 remains on. The output signal Vo being at a logic low level is inverted by the inverter 395 and input to the AND gate 393. Although the output of the inverter 395 is at a logic high level, since the external control signal RS is at a logic low, the output of the AND gate 393 is still held low. Thus, the PMOS transistor 342 remains on.

When the external control signal RS transitions from a logic low level to a logic high level, the output of the NAND gate 391 is held high since the output signal Vo is at a logic low level. Thus, the NMOS transistor 341 remains on. Since the inputs of the AND gate 393 are both at a logic high level, the output of the AND gate 393 is changed into a logic high level. Since the output of the AND gate 393 is at a logic low level, the PMOS transistor 342 is turned off. Thus, the output signal Vo is latched to a logic low level.

As described above, when the zapping element 351 is a short, and the external control signal RS transitions to a logic high level, the output signal Vo is latched to a logic high level. At this time, since the NMOS transistor 341 is turned off, the power consumption of the semiconductor device 301 is reduced as compared to conventional configurations. When the zapping element 351 is opened, and the external control signal RS is activated to a logic high level, the output signal Vo is latched to a logic low level. At this time, since the PMOS transistor 342 is turned off, the power consumption of the semiconductor device 301 is reduced as compared to conventional configurations.

Figure 4:
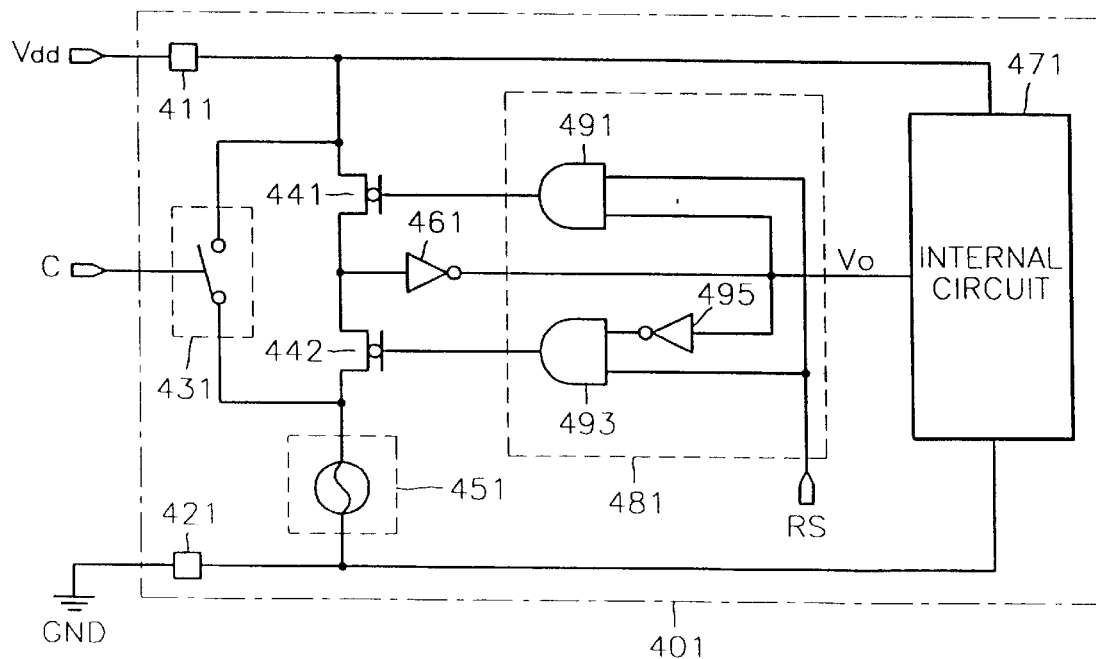
FIG. 4 is a schematic circuit diagram illustrating a semiconductor device having a deactivation fuse according to a third embodiment of the present invention.

FIG. 4 is a schematic circuit diagram illustrating a semiconductor device 401 having a zapping circuit according to a third embodiment of the present invention. Referring to FIG. 4, the semiconductor device 401 includes a power source pin 411, a ground pin 421, a switching element 431, first and second active elements, that is, first and second PMOS transistors 441 and 442, a zapping element 451, an inverter 461, a logic circuit 481 and an internal circuit 471. The switching element 431, the power source pin 411, the ground pin 421 and the zapping element 451 have the same configuration and operation as those of the semiconductor device 201 shown in FIG. 2.

The power source pin 411 is connected to the first PMOS transistor 441, and the first and second PMOS transistors 441 and 442 are connected in series with each other. In other words, the power source pin 411 is coupled to the source of the first PMOS transistor 441, and the drain of the first PMOS transistor 441 is connected to the source of the second PMOS transistor 442. The input terminal of the inverter 461 is connected to the connection point of the drain of the first PMOS transistor 441 and the source of the second PMOS transistor 442, and an output signal Vo is generated by the inverter 461. The first and second PMOS transistors 441 and 442 are both gated by the outputs of the logic circuit 481, as described above.

The sizes of the first and second PMOS transistors 441 and 442 are determined in consideration of their desired turn-on resistances. The turn-on resistance of the first PMOS transistor 441 is preferably larger than that of the second PMOS transistor 442. In a state where the zapping element 451 is a short circuit, if an external control signal RS is applied, the input voltage of the inverter 461 falls to a logic low level. At this time, for the input voltage of the inverter 461 to fall to a sufficiently low level, the turn-on resistance of the second PMOS transistor 442 must be sufficiently smaller than that of the first PMOS transistor 441. In a state where the zapping element 451 is an open circuit, if an external control signal RS is applied, the input voltage of the inverter 461 rises to a logic high level. At this time, for the input voltage of the inverter 461 to rise to a sufficiently high level, the turn-on resistance of the first PMOS transistor 441 must be sufficiently larger than that of the second PMOS transistor 442.

The logic circuit 481 controls the operation of the first and second PMOS transistors 441, 442 in response to the external control signal RS, e.g., a reset signal. The logic circuit 481 includes a first AND gate 491, a second AND gate 493, and an inverter 495. The first AND gate 491 performs an AND operation on the external control signal RS and the output signal Vo, and applies the result to the gate of the first PMOS transistor 441. In other words, if either the external control signal RS or the output signal Vo is at a logic low level, then the output of the first AND gate 491 transitions to "low". If both the external control signal RS and the output signal Vo are at a logic high level, the output of the first AND gate 491 transitions to "high". The inverter 495 inverts the output signal Vo, which is applied to the second AND gate 493. The second AND gate 493 performs an AND operation on the output of the inverter 495 and the external control signal RS, and applies the result to the gate of the second PMOS transistor 442. In other words, if either the output of the inverter 495 or the external control signal RS is at a logic low level, the output of the second AND gate 493 becomes "low". If both the output of the inverter 495 and the external control signal RS are at a logic high level, the output of the second AND gate 493 becomes "high".

The operation of the zapping circuit shown in FIG. 4 will now be described, in terms of the two conditions stated above. It is assumed that the switching element 431 is open, and the power source pin 411 and ground pin 421 are connected to the power supply voltage Vdd and the ground terminal GND, respectively.

First, the operation of the zapping circuit of FIG. 4 will be described in the case when the zapping element 451 is shorted. Initially, the external control signal RS is held low. The first and second AND gates 491 and 493 both output logic high signals. Accordingly, the first and second PMOS transistors 441 and 442 are both turned on, and thus the input voltage of the inverter 461 falls to the voltage of the ground terminal GND. Therefore, the output signal Vo becomes "high". Even though the output signal Vo at a logic high level is input to the first AND gate 491, since the external control signal RS is still maintained at a logic low level, the output of the first AND gate 491 is held low, whereby the first PMOS transistor 441 remains on. The output signal Vo at a logic high level is inverted by the inverter 495 and input to the second AND gate 493. Since the two inputs of the second AND gate 493 are both at a logic low level, the output of the second AND gate 493 remains low. Thus, the second PMOS transistor 442 remains on.

When the external control signal RS transitions from a logic low level to a logic high level, since the inputs of the first AND gate 491 are both at a logic high level, the output of the first AND gate 491 changes to a logic high level. Thus, the first PMOS transistor 441 is turned off. The output of the second AND gate 493 is held low, since the output of the inverter 495 is at a logic low level. Since the output of the second AND gate 493 is at a logic low level, the second PMOS transistor 442 remains on. Thus, the output signal Vo is latched to a logic high level.

The operation of the zapping circuit of FIG. 4 will now be described for the case when the zapping element 451 is open. Initially, the external control signal RS is held low, and the first and second AND gates 491 and 493 both output logic high level signals. Accordingly, the first and second PMOS transistors 441 and 442 are both turned on. However, since the zapping element 451 is an open circuit, the input voltage of the inverter 461 increases to nearly the power supply voltage Vdd. Therefore, the output signal Vo becomes "low". Since the output signal Vo at a logic low level is input to the first AND gate 491, the output of the first AND gate 491 is held low, whereby the first PMOS transistor 441 remains on. The output signal Vo at a logic low level is inverted by the inverter 495 and input to the second AND gate 493. Since the output of the inverter 495 is at a logic low level and the external control signal RS is at a logic low level, the output of the second AND gate 493 remains high. Thus, the second PMOS transistor 442 remains on.

When the external control signal RS transitions from a logic low level to a logic high level, the output of the first AND gate 491 is held low since the output signal Vo is at a logic low level. Thus, the first PMOS transistor 441 remains on. The output of the second AND gate 493 changes to a logic high level, since the inputs of the second AND gate 493 are both at a logic high level. Since the output of the second AND gate 493 is at a logic high level, the second PMOS transistor 442 is turned off. Thus, the output signal Vo is latched to a logic low level.

As described above, when the zapping element 451 is a short circuit, and the external control signal RS transitions to a logic high level, the output signal Vo is latched to a logic high level. At this time, since the first PMOS transistor 441 is turned off, the power consumption of the semiconductor device 401 is reduced as compared to conventional configurations. When the zapping element 451 is an opened circuit, and the external control signal RS is activated to a logic high level, the output signal Vo is latched to a logic low level. At this time, since the second PMOS transistor 442 is turned off, the power consumption of the semiconductor device 401 is reduced as compared to conventional configurations.

Figure 5:
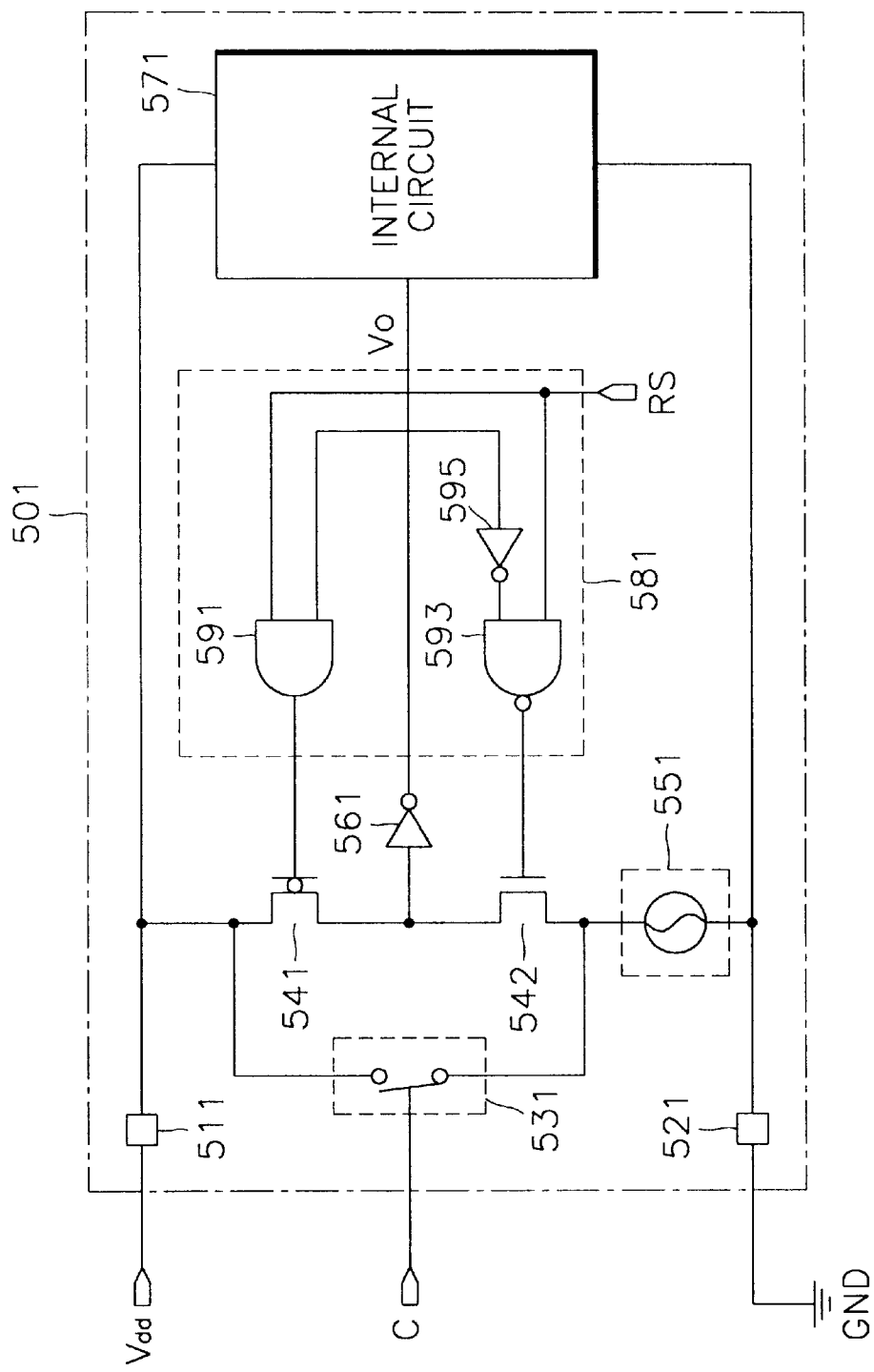
FIG. 5 is a schematic circuit diagram illustrating a semiconductor device having a deactivation fuse according to a fourth embodiment of the present invention.

FIG. 5 is a schematic circuit diagram illustrating a semiconductor device 501 having a zapping circuit according to a fourth embodiment of the present invention. Referring to FIG. 5, the semiconductor device 501 includes a power source pin 511, a ground pin 521, a switching element 531, a first active element, that is, an PMOS transistor 541, a second active element, that is, an NMOS transistor 542, a zapping element 551, an inverter 561, a logic circuit 581 and an internal circuit 571. The switching element 531, the power source pin 511, the ground pin 521 and the zapping element 551 have the same configuration and operation as those of the semiconductor device 201 shown in FIG. 2.

The power source pin 511 is connected to the PMOS transistor 541, and the PMOS transistor 541 and the NMOS transistor 542 are connected in series with each other. In other words, the power source pin 511 is connected to the source of the PMOS transistor 541, and the drain of the PMOS transistor 541 is connected to the drain of the NMOS transistor 542. The input terminal of the inverter 561 is coupled to the connection point of the drain of the PMOS transistor 541 and the drain of the NMOS transistor 542, and an output signal Vo is generated by the inverter 561. The PMOS transistor 541 and the NMOS 542 are both gated by the outputs of the logic circuit 581, as described above.

The sizes of the PMOS transistor 541 and the NMOS transistor 542 are determined in consideration of their desired turn-on resistances. The turn-on resistance of the PMOS transistor 541, is preferably larger than that of the NMOS transistor 542. In a state where the zapping element 551 is a short, if an external control signal RS is applied, the input voltage of the inverter 561 falls to a logic low level. At this time, for the input voltage of the inverter 561 to fall to a sufficiently low level, the turn-on resistance of the NMOS transistor 542 must be sufficiently smaller than that of the PMOS transistor 541. Also, in a state where the zapping element 551 is opened, if an external control signal RS is applied, the input voltage of the inverter 561 rises to a logic high level. At this time, for the input voltage of the inverter 561 to rise to a sufficiently high level, the turn-on resistance of the PMOS transistor 541 must be sufficiently larger than that of the NMOS transistor 542.

The logic circuit 581 controls the operation of the PMOS transistor 541 and the NMOS transistor 542 in response to the external control signal RS, e.g., a reset signal. The logic circuit 581 includes an AND gate 591, a NAND gate 593, and an inverter 595. The AND gate 591 performs an AND operation on the external control signal RS and the output signal Vo, and applies the result to the gate of the PMOS transistor 541. In other words, if either the external control signal RS or the output signal Vo is at a logic low level, then the output of the AND gate 591 becomes "low". If both the external control signal RS and the output signal Vo are at a logic high level, the output of the AND gate 591 becomes "high". The inverter 595 inverts the output signal Vo, which is applied to the NAND gate 593. The NAND gate 593 performs a NAND operation on the output of the inverter 595 and the external control signal RS and applies the result to the gate of the NMOS transistor 542. In other words, if either the output of the inverter 595 or the external control signal RS is at a logic low level, the output of the NAND gate 593 becomes "high". If both the output of the inverter 595 and the external control signal RS are at a logic high level, the output of the NAND gate 593 becomes "low".

The operation of the zapping circuit shown in FIG. 5 will now be described, in terms of the two conditions stated above. It is assumed that the switching element 531 is open, and the power source pin 511 and ground pin 521 are connected to the power supply voltage Vdd and the ground terminal GND, respectively.

First, the operation of the zapping circuit of FIG. 5 will be described in the case when the zapping element 551 is a short circuit. Initially, the external control signal RS is held low. The AND gate 591 outputs a logic low level signal, and the NAND gate 593 outputs a logic high level signal. Accordingly, the PMOS transistor 541 and the NMOS transistor 542 are both turned on, and thus the input voltage of the inverter 561 falls to the voltage of the ground terminal GND. Therefore, the output signal Vo becomes "high". Even if the output signal Vo at a logic high level is input to the AND gate 591, since the external control signal RS is still maintained at a logic low level, the output of the AND gate 591 is held low, whereby the PMOS transistor 541 remains on. The output signal Vo at a logic high level is inverted by the inverter 595 and input to the NAND gate 593. Since the two inputs of the NAND gate 593 are both at a logic low level, the output of the NAND gate 593 remains high. Thus, the NMOS transistor 542 remains on.

When the external control signal RS transitions from a logic low level to a logic high level, the output of the AND gate 591 changes to a logic high level, since the inputs of the AND gate 591 are both at a logic high level. Thus, the PMOS transistor 541 is turned off. The output of the NAND gate 593 is held high since the output of the inverter 595 is at a logic low level. Since the output of the NAND gate 593 is at a logic high level, the NMOS transistor 542 remains on. Thus, the output signal Vo is latched to a logic high level.

The operation of the zapping circuit of FIG. 5 will now be described for the case where the zapping element 551 is an open circuit. Initially, the external control signal RS is held low, and the AND gate 591 outputs a logic low level signal and the NAND gate 593 outputs logic low high signal. Accordingly, the PMOS transistor 541 and the NMOS transistor 542 are both turned on. However, since the zapping element 551 is an open circuit, the input voltage of the inverter 561 increases to nearly the power supply voltage Vdd. Therefore, the output signal Vo becomes "low". Since the external signal RS and the output signal Vo at a logic low level is input to the AND gate 591, the output of the AND gate 591 is held low, whereby the PMOS transistor 541 remains on. The output signal Vo at a logic low level is inverted by the inverter 595 and input to the NAND gate 593. Although the output of the inverter 595 is at a logic high level, since the external control signal RS is at a logic low, the output of the NAND gate 593 remains high. Thus, the NMOS transistor 542 remains on.

When the external control signal RS transitions from a logic low level to a logic high level, the output of the AND gate 591 is held low since the output signal Vo is at a logic low level. Thus, the PMOS transistor 541 remains on. The output of the NAND gate 593 changes to a logic low level, since the inputs of the NAND gate 593 are both at a logic high level. Since the output of the NAND gate 593 is at a logic low level, the NMOS transistor 542 is turned off. Thus, the output signal Vo is latched to a logic low level.

As described above, when the zapping, element 551 is a short circuit and the external control signal RS transitions to a logic high level, the output signal Vo is latched to a logic high level. At this time, since the PMOS transistor 541 is turned off, the power consumption of the semiconductor device 501 is reduced as compared to conventional configurations. When the zapping element 551 is an opened circuit, the external control signal RS is activated to a logic high level, and the output signal Vo is latched to a logic low level. At this time, since the NMOS transistor 542 is turned off, the power consumption of the semiconductor device 501 is reduced as compared to conventional configurations.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A semiconductor device comprising:

a logic circuit for generating first and second internal control signals in response to an external control signal;

first and second active elements connected in series and activated by said corresponding internal control signals, a power supply voltage being applied to the first active element, the first and second active elements generating an output signal of a predetermined voltage in response to the internal control signals; and a deactivation fuse connected in series with the first and second active elements between a ground terminal and the second active element, the deactivation fuse having open and short states and the output signal being generated according to the state of the deactivation fuse, such that upon application of the external control signal, the output signal is latched, regardless of the state of the deactivation fuse.

2. The semiconductor device of claim 1, wherein the first and second active elements comprise transistors.

3. The semiconductor device of claim 1, wherein the output is generated at the interface of the first and second active elements.

4. The semiconductor device of claim 1, wherein the deactivation fuse is an electrical fuse which opens when a predetermined voltage is applied thereto.

5. The semiconductor device of claim 1, wherein the turn-on resistance of the first active element connected to the power supply voltage is larger than that of the second active element connected to the ground terminal.

6. The semiconductor device of claim 1 wherein, if the deactivation fuse is in an open state, the output signal is latched to a first logic level, and if the deactivation fuse in an a short state, the output signal is latched to a second logic level opposite the first logic level.

7. A semiconductor device comprising:

a logic circuit for generating first and second internal control signals in response to an external control signal;

a first transistor, a drain of which is coupled to a power supply voltage and a gate of which is driven by the first internal control signal, for generating an output signal at a source;

a second transistor in series with the first transistor, a drain of which is coupled to the source of the first transistor, and a gate of which is driven by the second internal control signal; and a zapping element connected in series with the first and second transistors between a ground terminal and a source of the second transistor, the zapping element having an open state and a short state, wherein if the zapping element is in an open state, then when the external control signal is applied, only the first transistor is activated, and if the zapping element is in a short state, then when the external control signal is applied, only the second transistor is activated, thereby latching the output signal regardless of the state of the deactivation fuse.

8. The semiconductor device according to claim 6, wherein the logic circuit comprises:

a first logic gate for performing a first operation on the external control signal and the output signal and applying the result to the gate of the first transistor;

an inverter gate for inverting the output signal; and a second logic gate for performing a second operation on the external control signal and the output of the inverter gate and applying the result to the gate of the second transistor.

9. The semiconductor device of claim 8, wherein the first and second transistors comprise NMOS transistors, and wherein the first and second operations comprise NAND operations.

10. The semiconductor device of claim 8, wherein the first transistor comprises a NMOS transistor and the second transistor comprises a PMOS transistor, and wherein the first operation comprises a NAND operation and the second operation comprises an AND operation.

11. The semiconductor device of claim 8, wherein the first and second transistors comprise PMOS transistors, and wherein the first and second operations comprise AND operations.

12. The semiconductor device of claim 8, wherein the first transistor comprises a PMOS transistor and the second transistor comprises a NMOS transistor, and wherein the first operation comprises an AND operation and the second operation comprises a NAND operation.

13. The semiconductor device of claim 8, wherein the turn-on resistance of the first transistor is larger than that of the second transistor.

* * * * *